United States Patent
Yamamoto

(10) Patent No.: US 11,222,822 B2
(45) Date of Patent: Jan. 11, 2022

(54) WORKPIECE CUTTING METHOD

(71) Applicant: DISCO CORPORATION, Tokyo (JP)

(72) Inventor: Naoko Yamamoto, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 77 days.

(21) Appl. No.: 16/738,210

(22) Filed: Jan. 9, 2020

(65) Prior Publication Data
US 2020/0227319 A1 Jul. 16, 2020

(30) Foreign Application Priority Data
Jan. 11, 2019 (JP) .............................. JP2019-003110

(51) Int. Cl.
| | |
|---|---|
| *G01N 21/95* | (2006.01) |
| *G01T 7/04* | (2006.01) |
| *G06T 7/00* | (2017.01) |
| *G01N 21/01* | (2006.01) |
| *H01L 21/67* | (2006.01) |
| *H01L 21/304* | (2006.01) |
| *H01L 21/82* | (2006.01) |

(Continued)

(52) U.S. Cl.
CPC ............ *H01L 21/78* (2013.01); *H01L 21/304* (2013.01); *H01L 21/67092* (2013.01); *H01L 21/6836* (2013.01); *H01L 22/12* (2013.01); *H01L 2221/68327* (2013.01)

(58) Field of Classification Search
CPC ..... B24B 27/0023; B24B 49/12; B24B 7/228; G01N 21/9501; H01L 21/78
See application file for complete search history.

(56) References Cited

U.S. PATENT DOCUMENTS

| | | | |
|---|---|---|---|
| 2010/0181681 A1* | 7/2010 | Akiba | ..................... H01L 21/78 257/773 |
| 2016/0284611 A1* | 9/2016 | Sekiya | ................. B28D 5/0064 |

(Continued)

FOREIGN PATENT DOCUMENTS

| | | |
|---|---|---|
| JP | 2009246015 A | 10/2009 |
| JP | 2011165847 A | 8/2011 |

(Continued)

OTHER PUBLICATIONS

Singapore Search Report for corresponding Singapore Patent Application No. 10202000252Q dated Nov. 8, 2021 (4 pages).

*Primary Examiner* — Brian Turner
(74) *Attorney, Agent, or Firm* — Greer, Burns & Crain, Ltd.

(57) ABSTRACT

A workpiece cutting method includes attaching a tape to a lower surface of the workpiece, holding the lower surface through the tape on a holding table including a holding plate, at least a part of a holding surface of the holding plate being an imaging area formed of a material transparent to visible light, cutting the workpiece held on the holding table to divide the workpiece, thereby forming a dividing groove, and imaging at least a part of the dividing groove from a upper surface side of the workpiece by using an upper camera portion located above the holding plate, thereby obtaining an upper image, and also imaging the above part of the dividing groove from the lower surface side of the workpiece through the imaging area of the holding plate and the tape by using a lower camera portion located below the holding plate, thereby obtaining a lower image.

16 Claims, 10 Drawing Sheets

(51) Int. Cl.
*H01L 21/687* (2006.01)
*H01L 21/78* (2006.01)
*H01L 21/683* (2006.01)
*H01L 21/66* (2006.01)

(56) References Cited

U.S. PATENT DOCUMENTS

2019/0057936 A1* 2/2019 Gupta .................. H01L 23/562
2020/0333261 A1   10/2020 Sugiyama et al.
2020/0381302 A1* 12/2020 Murakami .......... H01L 21/0475

FOREIGN PATENT DOCUMENTS

| | | | |
|---|---|---|---|
| JP | 2012256749 A | 12/2012 | |
| JP | 2013074198 A | 4/2013 | |
| JP | 2017013267 A | 1/2017 | |
| WO | 2017105520 A1 | 6/2017 | |

* cited by examiner

FIG.8A   FIG.8B
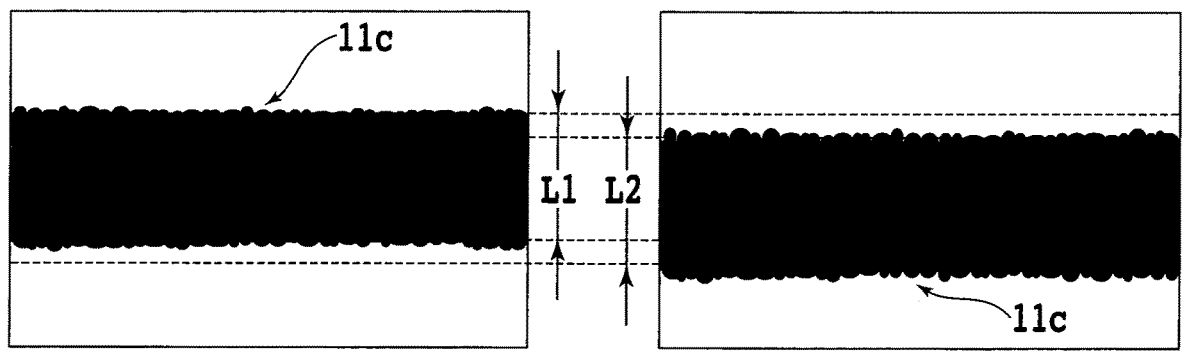
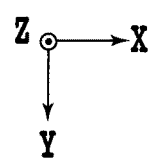
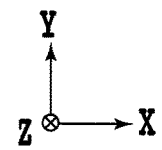
FIG.8C
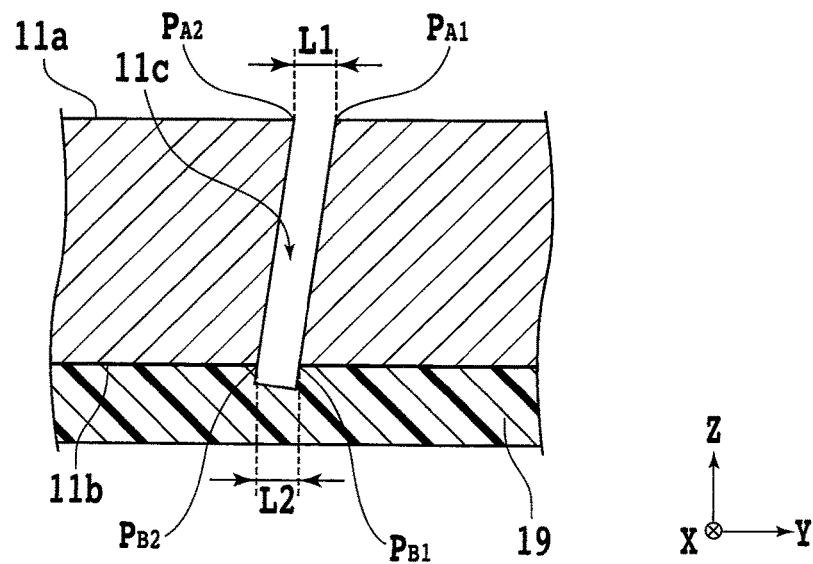

FIG.9A
FIG.9B
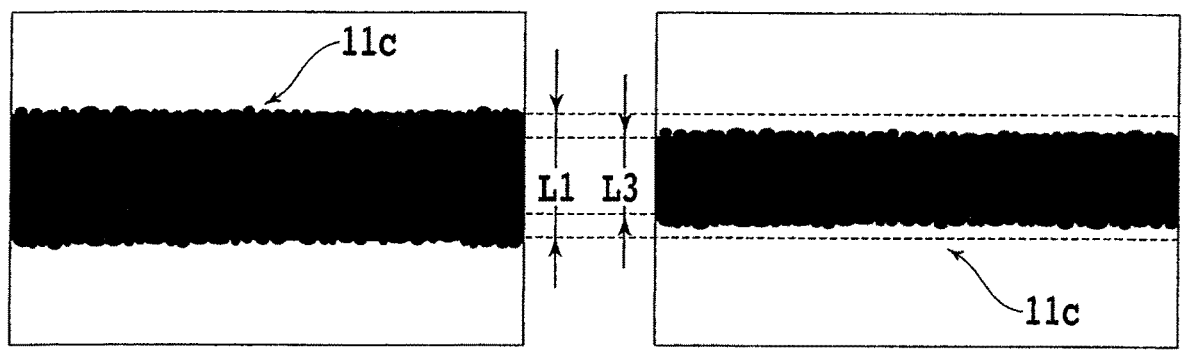
FIG.9C
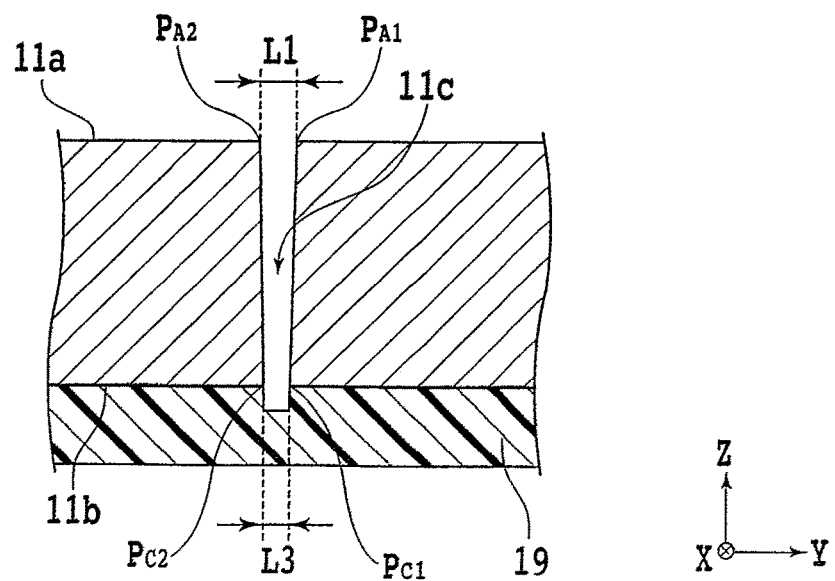

WORKPIECE CUTTING METHOD

BACKGROUND OF THE INVENTION

Field of the Invention

The present invention relates to a workpiece cutting method for cutting a workpiece to divide it into a plurality of chips.

Description of the Related Art

Conventionally known is a cutting apparatus having an annular cutting blade for cutting a plate-shaped workpiece such as a semiconductor wafer. In cutting the workpiece, the cutting blade is rotated at a high speed and then fed into the workpiece. At the same time, the cutting blade and the workpiece are relatively moved to thereby cut the workpiece along a path of this relative movement. A plurality of crossing division lines are previously set on the workpiece. In performing kerf check, the workpiece is cut along a predetermined number of division lines to form a dividing groove (kerf) in the workpiece along each division line. Thereafter, the position and shape of this dividing groove are checked. Usually, the kerf check is performed by using a camera or the like located above the workpiece to image the upper surface of the workpiece and thereby obtain an image of the dividing groove. Thereafter, according to this image, it is checked whether the workpiece has been properly cut along each division line or it is checked whether the size of chipping occurred in the dividing groove or the kerf width is less than or equal to an allowable value (see Japanese Patent Laid-Open No. 2009-246015 and Japanese Patent Laid-Open No. 2013-74198).

SUMMARY OF THE INVENTION

The workpiece is cut by using the cutting apparatus to obtain a plurality of chips. In the case that chipping having a size greater than an allowable value has occurred on the upper surface of any chip, this chip is handled as a defective chip. However, also when chipping having a size greater than the allowable value has occurred on the lower surface of any chip, this chip is handled as a defective chip. Further, also when the dividing groove is oblique with respect to the direction along the thickness of the workpiece (i.e., oblique cutting) or also when the position of the dividing groove is deviated from the position of the division line, defective chips may be produced. In usual kerf check, only the upper surface of the workpiece is checked. Accordingly, when the lower surface of the workpiece is defective, there is a high possibility that defective chips may be produced.

It is therefore an object of the present invention to provide a workpiece cutting method which can prevent the production of defective chips or can reduce the possibility that a large amount of defective chips may be produced.

In accordance with an aspect of the present invention, there is provided a workpiece cutting method for cutting a workpiece having an upper surface and a lower surface, including a tape attaching step of attaching a tape to the lower surface of the workpiece; a holding step of holding the lower surface of the workpiece through the tape on a holding table including a holding plate, the holding plate having a holding surface for holding the workpiece, at least a part of the holding surface being an imaging area formed of a material transparent to visible light; a processing step of cutting the workpiece held on the holding table to divide the workpiece, thereby forming a dividing groove having a depth reaching the tape; and an imaging step of imaging at least a part of the dividing groove from the upper surface side of the workpiece by using an upper camera portion located above the holding plate, thereby obtaining an upper image, and also imaging the part of the dividing groove from the lower surface side of the workpiece through the imaging area of the holding plate and the tape by using a lower camera portion located below the holding plate, thereby obtaining a lower image.

Preferably, the workpiece cutting method further includes an image comparing step of comparing the upper image and the lower image obtained in the imaging step.

Preferably, the image comparing step includes a step of comparing at least one of a difference in width between the dividing groove on the upper image and the dividing groove on the lower image and an amount of deviation in position between the dividing groove on the upper surface and the dividing groove on the lower image with an allowable condition previously set. The workpiece cutting method further includes a warning step of issuing a warning in a case that at least one of the difference in the width and the amount of deviation in position does not satisfy the allowable condition.

In the imaging step of the workpiece cutting method according to the present invention, the dividing groove is imaged from the upper surface side of the workpiece by the upper camera portion located above the holding plate, thereby obtaining the upper image. At the same time, the dividing groove is imaged from the lower surface side of the workpiece by the lower camera portion located below the holding plate, thereby obtaining the lower image. Accordingly, when the upper end of the dividing groove is checked, the lower end of the dividing groove can also be checked, so that not only defective processing on the upper surface of the workpiece, but also defective processing on the lower surface of the workpiece can be detected. When defective processing has occurred on the lower surface of the workpiece, the defective processing can be eliminated by any means. Accordingly, as compared with the case that kerf check on the lower surface of the workpiece is not performed, but kerf check on only the upper surface of the workpiece is performed, the production of defective chips can be prevented. If defective chips are produced, it is possible to reduce the possibility that a large amount of defective chips may be produced.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 8A is a plan view depicting an example of an upper image obtained in the imaging step;

FIG. 8B is a plan view depicting an example of a lower image obtained in the imaging step;

FIG. 8C is a schematic sectional view of the workpiece in an area corresponding to that depicted in FIGS. 8A and 8B;

FIG. 9A is a plan view depicting another example of the upper image;

FIG. 9B is a plan view depicting another example of the lower image;

FIG. 9C is a schematic sectional view of the workpiece in an area corresponding to that depicted in FIGS. 9A and 9B.

DETAILED DESCRIPTION OF THE PREFERRED EMBODIMENT

Figure 1A:
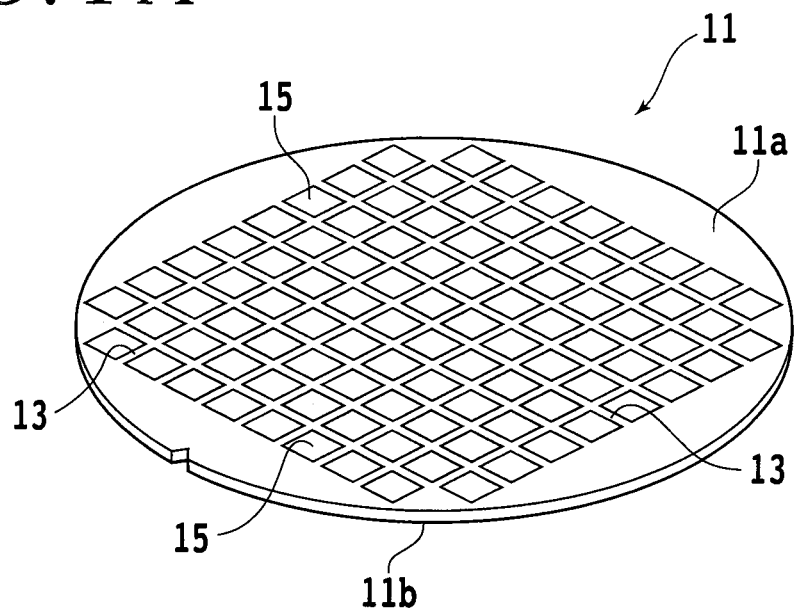
FIG. 1A is a perspective view of a workpiece.

A preferred embodiment of the present invention will now be described with reference to the attached drawings. A workpiece 11 will first be described. FIG. 1A is a perspective view of the workpiece 11. The workpiece 11 is a circular plate-shaped (i.e., disk-shaped) semiconductor wafer. The workpiece 11 has a front surface 11a and a back surface 11b opposite to the front surface 11a. A plurality of crossing division lines (streets) 13 are set on a side of the front surface 11a of the workpiece 11 to define a plurality of separate regions where a plurality of devices 15 are respectively formed. The crossing division lines 13 are composed of a plurality of parallel division lines extending in a first direction and a plurality of parallel division lines extending in a second direction perpendicular to the first direction.

The workpiece 11 is not limited in a material, a shape, a structure, a size, etc. While the workpiece 11 is formed of a semiconductor such as silicon in the preferred embodiment, the workpiece 11 may be formed of any other semiconductors such as gallium arsenide (GaAs) and silicon carbide (SiC). Further, the workpiece 11 may also be formed of a dielectric, metal oxide such as $LiTaO_3$ and $LiNbO_3$, glass, or ceramic, for example. Further, the workpiece 11 may be a semiconductor package substrate having a resin mold layer. The devices 15 formed on the workpiece 11 are also not limited in a kind, a number, a shape, a structure, a size, a layout, etc. Further, the devices 15 may not be formed on the workpiece 11.

Figure 1B:
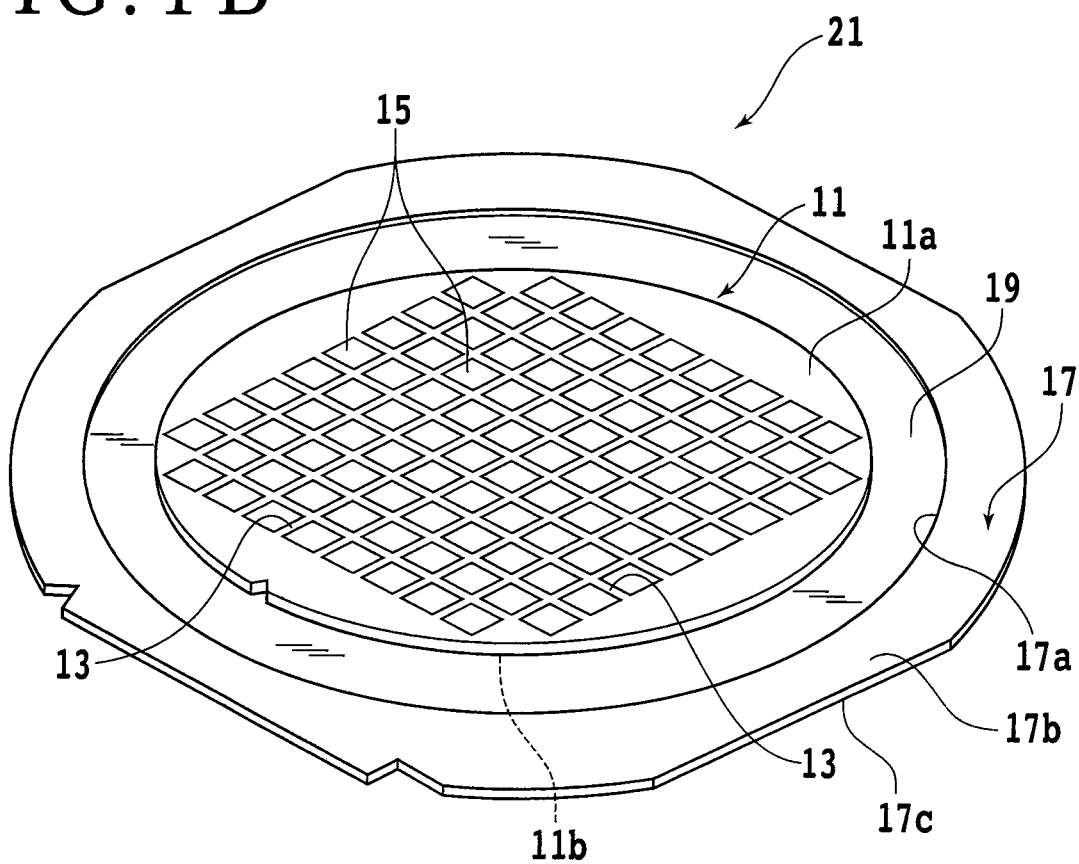
FIG. 1B is a perspective view of a workpiece unit.

A ring frame 17 having a circular opening 17a is arranged around the workpiece 11. The circular opening 17a has a diameter larger than that of the workpiece 11. The ring frame 17 is formed of metal. The workpiece 11 is located in the circular opening 17a of the ring frame 17. A circular tape 19 is attached to the workpiece 11 and the ring frame 17. The circular tape 19 has a diameter larger than that of the circular opening 17a of the ring frame 17. The ring frame 17 has a first surface 17b (lower surface as viewed in FIG. 1B) and a second surface 17c (upper surface as viewed in FIG. 1B). The circular tape 19 is attached to the back surface 11b of the workpiece 11 and the first surface 17b of the ring frame 17. The tape 19 is a resin film having a layered structure composed of a base layer (not depicted) and an adhesive layer (not depicted) formed on the base layer. The base layer is a nonadhesive resin layer, and the adhesive layer is an ultraviolet curing resin layer, for example. The adhesive layer is formed on the whole of one side surface of the base layer. Thus, the workpiece 11 and the ring frame 17 are united through the tape 19 to thereby form a workpiece unit 21 depicted in FIG. 1B. FIG. 1B is a perspective view of the workpiece unit 21. The ring frame 17 is not essential. In the case that the ring frame 17 is not used, the tape 19 has a diameter equal to that of the workpiece 11, and the tape 19 is attached to a side of the back surface 11b of the workpiece 11 to thereby form the workpiece unit 21 with the ring frame 17 omitted.

Figure 2:
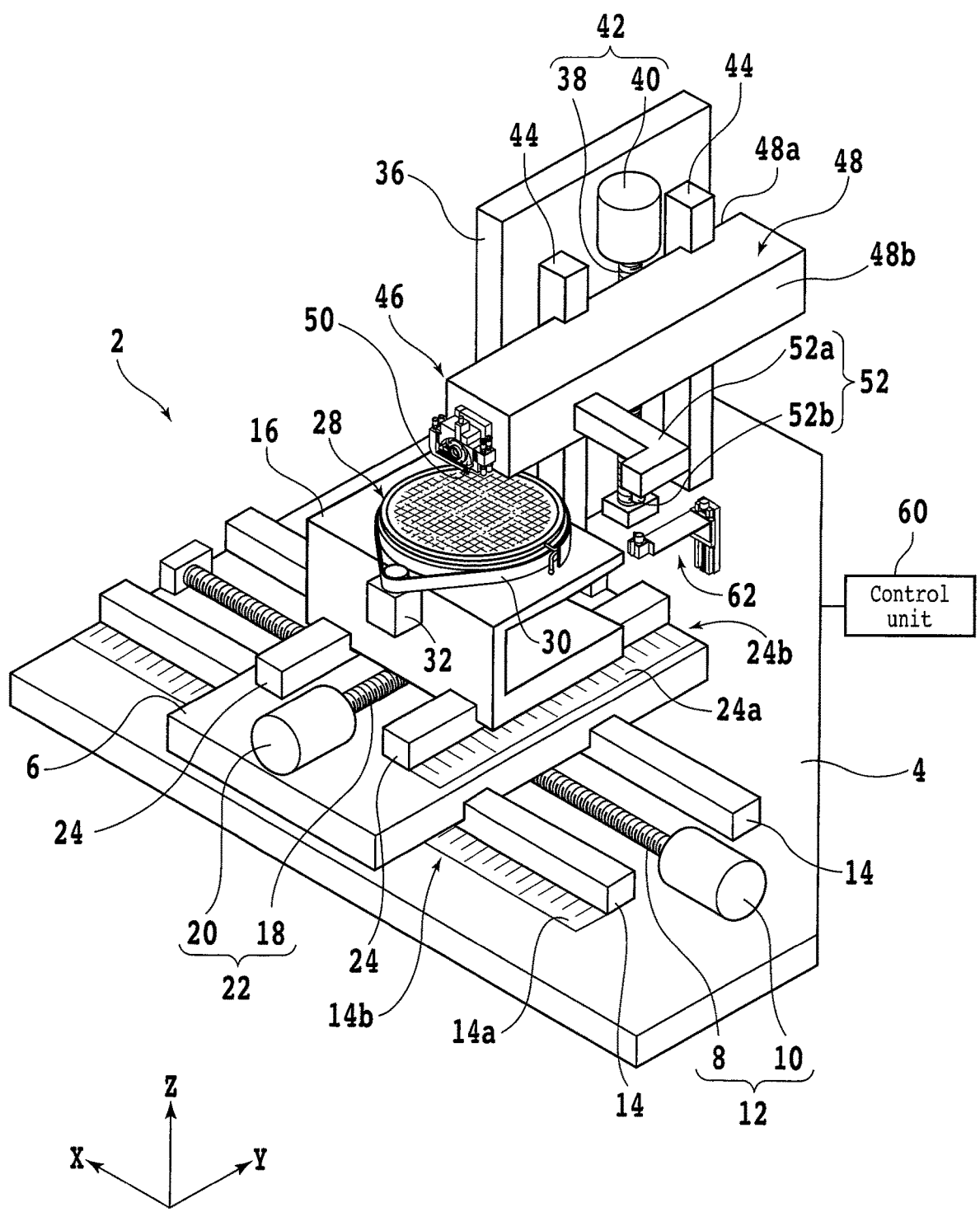
FIG. 2 is a perspective view of a cutting apparatus.

The workpiece 11 is processed by using a cutting apparatus 2 depicted in FIG. 2. FIG. 2 is a perspective view of the cutting apparatus 2. The cutting apparatus 2 has a stationary base 4 formed of metal such as stainless steel. A pair of guide rails 14 are provided on the stationary base 4 so as to extend in the X direction depicted by an arrow X in FIG. 2. A ball screw 8 is provided between the pair of guide rails 14 so as to extend in the X direction. A pulse motor 10 for rotating the ball screw 8 is connected to one end of the ball screw 8. An X movable plate 6 is provided above the ball screw 8 so as to be slidably mounted on the pair of guide rails 14. The X movable plate 6 is formed of metal such as stainless steel. A nut portion (not depicted) is formed on the lower surface of the X movable plate 6 so as to be threadedly connected to the ball screw 8. The ball screw 8 and the pulse motor 10 constitute an X moving mechanism 12. Accordingly, when the ball screw 8 is rotated by the pulse motor 10, the X movable plate 6 is moved in the X direction along the pair of guide rails 14.

A linear scale 14a is provided on the upper surface of the stationary base 4 so as to extend along one of the guide rails 14. A read head (not depicted) for reading the marks on the linear scale 14a is provided on the lower surface of the X movable plate 6. The linear scale 14a and this read head constitute a detecting unit 14b for detecting a feed amount as the amount of movement of the workpiece 11 in the X direction. A pair of guide rails 24 are provided on the upper surface of the X movable plate 6 so as to extend in the Y direction depicted by an arrow Y in FIG. 2. A ball screw 18 is provided between the pair of guide rails 24 so as to extend in the Y direction. A pulse motor 20 for rotating the ball screw 18 is connected to one end of the ball screw 18. A support member 16 is provided above the ball screw 18 so as to be slidably mounted on the pair of guide rails 24. The support member 16 is formed of metal such as stainless steel. A nut portion (not depicted) is formed on the lower surface of the support member 16 so as to be threadedly connected to the ball screw 18. The ball screw 18 and the pulse motor 20 constitute a Y moving mechanism 22. Accordingly, when the ball screw 18 is rotated by the pulse motor 20, the support member 16 is moved in the Y direction along the pair of guide rails 24.

Figure 3:
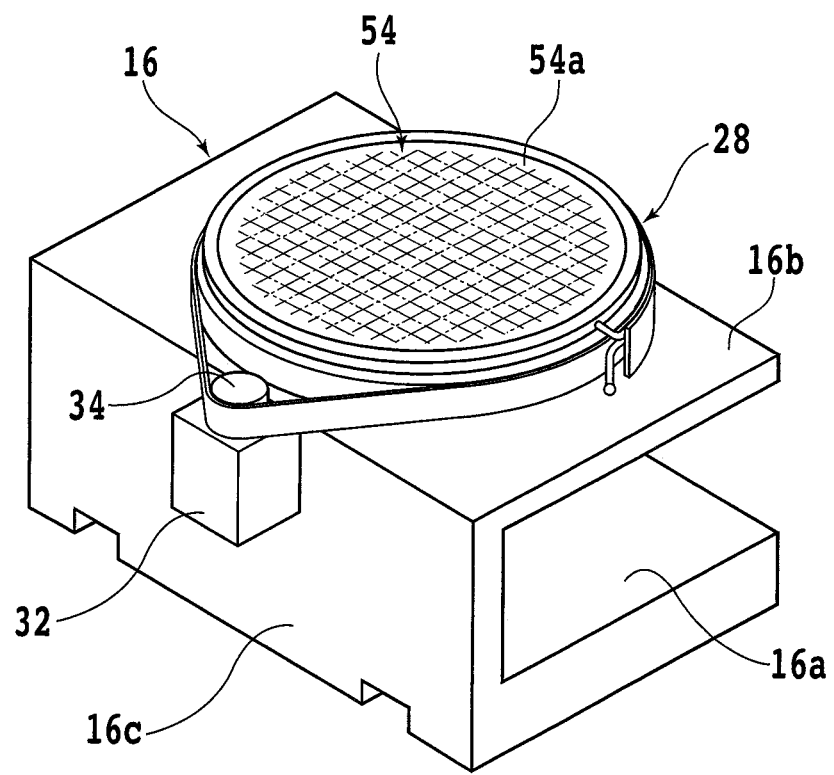
FIG. 3 is a perspective view of a chuck table supported to a support member.

A linear scale 24a is provided on the upper surface of the X movable plate 6 so as to extend along one of the guide rails 24. A read head (not depicted) for reading the marks on the linear scale 24a is provided on the lower surface of the support member 16. The linear scale 24a and this read head constitute a detecting unit 24b for detecting an index amount as the amount of movement of the workpiece 11 in the Y direction. As depicted in FIG. 3, the support member 16 includes a lower plate 16a adapted to be mounted on the guide rails 24, an upper plate 16b provided above the lower plate 16a so as to be opposed thereto, and a connecting plate 16c for connecting one end of the lower plate 16a and one end of the upper plate 16b. The upper plate 16b has a circular opening (not depicted), and a substantially cylindrical chuck table (holding table) 28 is rotatably mounted in this circular opening of the upper plate 16b. FIG. 3 is a perspective view of the chuck table 28 supported to the support member 16. An upper portion of the chuck table 28 projects upward from the upper plate 16b.

A plurality of clamp mechanisms 56 (see FIGS. 6A and 6B) are provided on the cylindrical surface of the upper portion of the chuck table 28 at a predetermined vertical position. These plural clamp mechanisms 56 are located at different positions in the circumferential direction of the chuck table 28. In FIG. 3, the plural clamp mechanisms 56 are not depicted. Each clamp mechanism 56 functions to fix the ring frame 17 of the workpiece unit 21 placed on the chuck table 28 by holding a part of the ring frame 17. A belt 30 for rotating the chuck table 28 is wrapped on the cylindrical surface of the upper portion of the chuck table 28 in an area between the clamp mechanisms 56 and the upper plate 16b in the vertical direction of the chuck table 28 (in the Z direction depicted by an arrow Z in FIG. 3). That is, this area of the upper portion of the chuck table 28 is a belt wrapping portion.

A motor 32 having an output shaft is mounted on the connecting plate 16c of the support member 16, and a pulley 34 is connected to the output shaft of the motor 32. The belt 30 is wrapped between the pulley 34 and the belt wrapping portion of the chuck table 28. Accordingly, when the motor 32 is operated, the chuck table 28 is rotated through the belt 30. The motor 32 is a pulse motor, for example. In performing alignment, the motor 32 is operated by a predetermined number of pulses, the chuck table 28 is rotated about its vertical axis by a predetermined angle θ. Accordingly, the division lines 13 extending in the first direction are made parallel to the X direction.

A circular holding plate 54 is provided on the upper surface of the chuck table 28. The holding plate 54 is formed of a transparent material (e.g., silica glass) transparent to visible light. The holding plate 54 has an upper surface as a holding surface 54a for holding the workpiece 11. A plurality of fine holes (not depicted) are formed on the whole of the holding surface 54a of the holding plate 54. Each fine hole is connected to a suction passage (not depicted) formed in the holding plate 54. Each suction passage is connected to a vacuum source (not depicted). Accordingly, when the workpiece 11 of the workpiece unit 21 is placed on the holding plate 54 through the tape 19 and the vacuum source is operated, the workpiece 11 is held on the holding surface 54a of the holding plate 54 under suction. In the case that the side of the back surface 11b of the workpiece 11 is held on the chuck table 28, the back surface 11b of the workpiece 11 becomes a lower surface of the workpiece 11 and the front surface 11a of the workpiece 11 becomes an upper surface of the workpiece 11.

Figure 4:
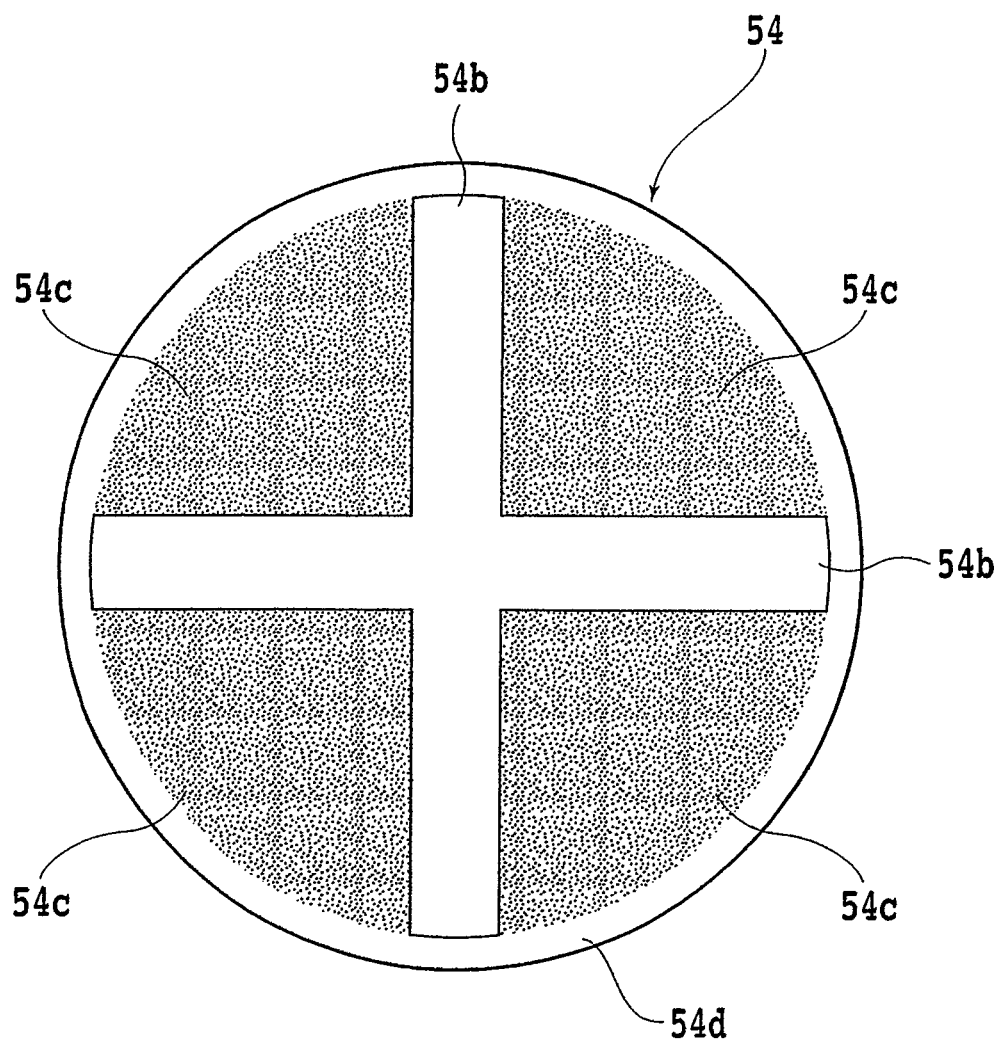
FIG. 4 is a plan view of a holding plate.

The structure of the holding plate 54 will now be described with reference to FIG. 4. FIG. 4 is a plan view of the holding plate 54. The holding plate 54 has a suction passage excluding area 54b where no suction passages are formed. The suction passage excluding area 54b has a crossing shape as viewed in plan so as to partition the holding plate 54 into four sectorial areas each having a central angle of 90 degrees. Each sectorial area is a suction passage including area 54c where a plurality of suction passages are formed. In each suction passage including area 54c, the suction passages are arranged in rows and columns like a mesh over the area.

Each suction passage extends through the thickness of the holding plate 54 at a predetermined position in the vicinity of an arcuate peripheral portion of each suction passage including area 54c and reaches the back side of the holding plate 54 opposite to the holding surface 54a. Each suction passage is connected to the vacuum source such as an ejector on the back side of the holding plate 54. Further, the remaining annular area formed outside the suction passage excluding area 54b and the suction passage including areas 54c is a peripheral area 54d where no suction passages are formed. Since no suction passages are formed in the suction passage excluding area 54b and the peripheral area 54d, light is less prone to scatter in the suction passage excluding area 54b and the peripheral area 54d than in the suction passage including areas 54c.

However, all of the suction passage excluding area 54b, the suction passage including areas 54c, and the peripheral area 54d are transparent to visible light. Accordingly, in the case of imaging the workpiece 11 placed on the holding surface 54a from the under side of the holding plate 54, all of the suction passage excluding area 54b, the suction passage including areas 54c, and the peripheral area 54d function as an imaging area allowing the visible light to pass through the holding plate 54 from the back side (lower surface) to the front side (upper surface) thereof. As a modification, all of the holding plate 54 may not be formed of a transparent material. That is, a part of the holding plate 54 may be formed of an opaque material not transparent to visible light. For example, the suction passage including areas 54c and the peripheral area 54d may be formed of an opaque material such as porous ceramic. In this case, the suction passage including areas 54c and the peripheral area 54d do not function as the imaging area.

Referring back to FIG. 2, a plate-shaped first vertical column 36 is provided on the stationary base 4 so as to vertically extend in the Z direction. The lower end of the first vertical column 36 is fixed to the stationary base 4. A pair of guide rails 44 are provided on one side surface of the first vertical column 36 so as to extend in the Z direction. A ball screw 38 is provided between the pair of guide rails 44 so as to extend in the Z direction. A pulse motor 40 for rotating the ball screw 38 is connected to one end of the ball screw 38. A cutting unit 46 is slidably mounted on the pair of guide rails 44 so as to be movable in the Z direction. The cutting unit 46 has a spindle housing 48 extending in the Y direction. The spindle housing 48 has a shape like a rectangular prism.

The spindle housing 48 has a first side surface 48a opposed to the first vertical column 36 and a second side surface 48b opposite to the first side surface 48a. The first side surface 48a of the spindle housing 48 is provided with a nut portion (not depicted) threadedly connected to the ball screw 38. The ball screw 38 and the pulse motor 40 constitute a first Z moving mechanism 42. Accordingly, when the ball screw 38 is rotated by the pulse motor 40, the spindle housing 48 is moved in the Z direction along the pair of guide rails 44. A spindle (not depicted) extending in the Y direction is rotatably supported in the spindle housing 48. A motor (not depicted) for rotating the spindle is connected to one end of the spindle. The other end of the spindle projects from the spindle housing 48, and a cutting blade 50 is detachably mounted on the other end of the spindle. Accordingly, when the spindle is rotated by the motor, the cutting blade 50 is rotated.

Figure 5:
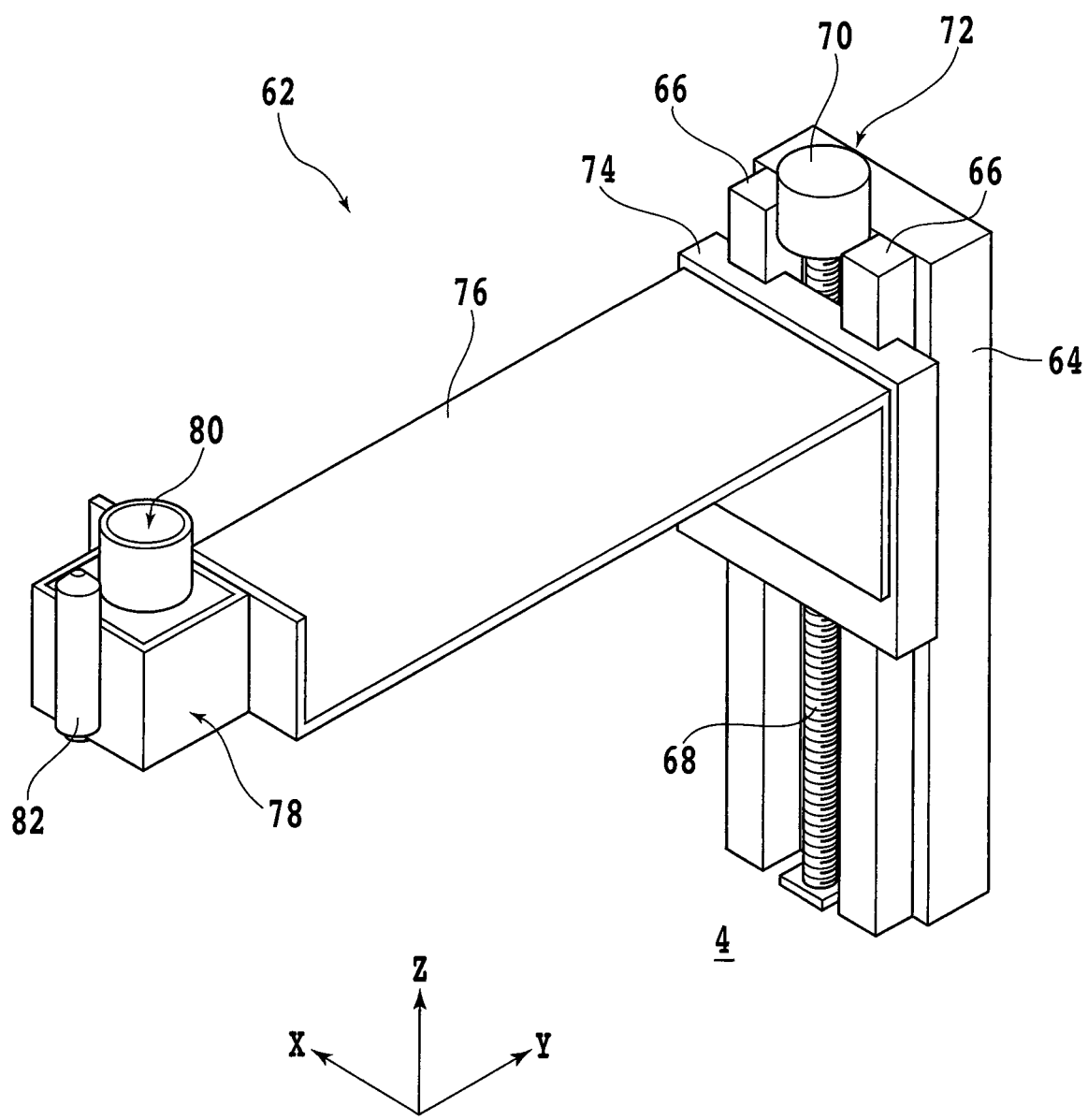
FIG. 5 is a perspective view of a lower imaging unit.

An arm portion 52a extends from the second side surface 48b of the spindle housing 48, and an upper camera portion 52b is provided at the front end of the arm portion 52a so as to be oriented downward. The upper camera portion 52b is set at a level higher than that of the holding plate 54. The arm portion 52a and the upper camera portion 52b constitute an upper imaging unit 52. The upper camera portion 52b has an illuminating unit (not depicted) for applying visible light to the workpiece 11 and an imaging device (not depicted) such as a charge-coupled device (CCD) for detecting the visible light reflected on the workpiece 11 to thereby image the workpiece 11. A lower imaging unit 62 is provided so as to be opposed to the upper imaging unit 52 in the Z direction. FIG. 5 is a perspective view of the lower imaging unit 62.

As depicted in FIG. 5, the lower imaging unit 62 has a plate-shaped second vertical column 64 extending in the Z direction. The lower end of the second vertical column 64 is fixed to the stationary base 4. A pair of guide rails 66 are provided on one side surface of the second vertical column 64 so as to extend in the Z direction. A ball screw 68 is provided between the pair of guide rails 66 so as to extend in the Z direction. A pulse motor 70 for rotating the ball screw 68 is connected to one end of the ball screw 68. A Z movable plate 74 is slidably mounted on the pair of guide rails 66 so as to be movable in the Z direction. The Z movable plate 74 has a first side surface 74a opposed to the second vertical column 64 and a second side surface 74b opposite to the first side surface 74a. The first side surface 74a of the Z movable plate 74 is provided with a nut portion (not depicted) threadedly connected to the ball screw 68.

The ball screw 68 and the pulse motor 70 constitute a second Z moving mechanism 72. Accordingly, when the ball screw 68 is rotated by the pulse motor 70, the Z movable plate 74 is moved in the Z direction along the pair of guide rails 66. A support plate 76 is fixed at one end portion thereof to the second side surface 74b of the Z movable plate 74. The support plate 76 extends in the Y direction. A lower camera portion 78 is fixed to the other end portion of the support plate 76. The lower camera portion 78 is set at a level lower than that of the holding plate 54. The lower camera portion 78 has a camera body portion 80 including an imaging device (not depicted) for detecting reflected light from the workpiece 11 and converting it into an electrical signal. The lower camera portion 78 further has an illuminating unit 82 for applying visible light to the workpiece 11. The illuminating unit 82 is mounted on one side surface of the camera body portion 80 opposite to the support plate 76 in the Y direction.

The camera body portion 80 in the lower camera portion 78 has an objective lens (not depicted), and the upper camera portion 52b also has an objective lens (not depicted). The lower camera portion 78 is located so that the optical axis of the objective lens in the lower camera portion 78 coincides with the optical axis of the objective lens in the upper camera portion 52b. Accordingly, a part of the workpiece 11 to be imaged from the upper side thereof by the upper camera portion 52b can be imaged from the lower side thereof by the lower camera portion 78 at the same X-Y coordinate position. Referring back to FIG. 2, the upper area and the side area (front, rear, right, and left sides) of the stationary base 4 are surrounded by a cover member (not depicted), and a touch panel (not depicted) is provided on the front surface of the cover member. The touch panel functions both as an input unit for allowing an operator to input instructions to the cutting apparatus 2 and as a display unit for displaying an image of the workpiece 11, processing conditions, etc. The touch panel can also display letters or the like indicating a warning. The operator is informed of the warning displayed by the touch panel, thereby recognizing the occurrence of defective processing. Further, a warning lamp (not depicted) is also provided on the upper surface of the cover member. When the operator is informed of the above warning, the warning lamp is turned on. As a modification, a speaker (not depicted) for sounding the warning may further be provided in the cutting apparatus 2 in addition to the touch panel and the warning lamp mentioned above. In this case, when defective processing has occurred, the warning is sounded by the speaker.

The cutting apparatus 2 further has a control unit 60 such as a computer. The control unit 60 has a central processing unit (CPU), a read-only memory (ROM), a random access memory (RAM), a hard disk drive, etc. connected with each other through a host controller. The ROM, the RAM, and the hard disk drive constitute a storing portion, and the CPU performs computing according to a program and data stored in this storing portion. The control unit 60 can function as specific means so that the CPU reads the program stored in the storing portion to perform a cooperation of software and hardware resources. For example, the control unit 60 functions as a driving portion for controlling the operation of the X moving mechanism 12, the Y moving mechanism 22, the first Z moving mechanism 42, and the second Z moving mechanism 72. In the case that the X moving mechanism 12 is operated by the driving portion, an electrical signal indicating the feed amount detected by the detecting unit 14b is received by the driving portion to grasp the feed amount. In the case that the Y moving mechanism 22 is operated by the driving portion, an electrical signal indicating the index amount detected by the detecting unit 24b is received by the driving portion to grasp the index amount.

The control unit 60 functions also as an imaging portion for executing and controlling the imaging operation of the upper camera portion 52b and the lower camera portion 78 and functions also as an image forming portion for forming an image from the electrical signal received from the upper camera portion 52b and the lower camera portion 78. That is, the reflected light from the workpiece 11 is detected by the imaging device and then converted into an electrical signal, which is next sent to the image forming portion. The image forming portion next forms an image according to the electrical signal received. The control unit 60 functions also as a comparing portion for comparing an upper image obtained by using the upper camera portion 52b to image the upper surface of the workpiece 11 and a lower image obtained by using the lower camera portion 78 to image the lower surface of the workpiece 11. For example, the comparing portion compares the difference in width between a dividing groove 11c (to be hereinafter described) in the upper image and the dividing groove 11c in the lower image with an allowable value (i.e., allowable condition) for the difference in width previously stored and set in the storing portion.

Further, the comparing portion compares the amount of deviation in position between the dividing groove 11c in the upper image and the dividing groove 11c in the lower image with an allowable value (i.e., allowable condition) for the amount of deviation in position previously stored and set in the storing portion. In the case that at least one of the difference in width of the dividing groove 11c and the amount of deviation in position of the dividing groove 11c exceeds the preset allowable value (i.e., in the case that at least one of the difference in width and the amount of deviation in position does not satisfy the preset allowable condition), the control unit 60 operates the touch panel to display a warning. At this time, the control unit 60 may turn on the warning lamp, instead of operating the touch panel. Alternatively, the control unit 60 may turn on the warning lamp simultaneously with the operation of the touch panel (the display of the warning on the touch panel). In addition, the speaker may be operated to sound the warning. Accordingly, the operator can recognize the occurrence of defective processing.

Figure 10:
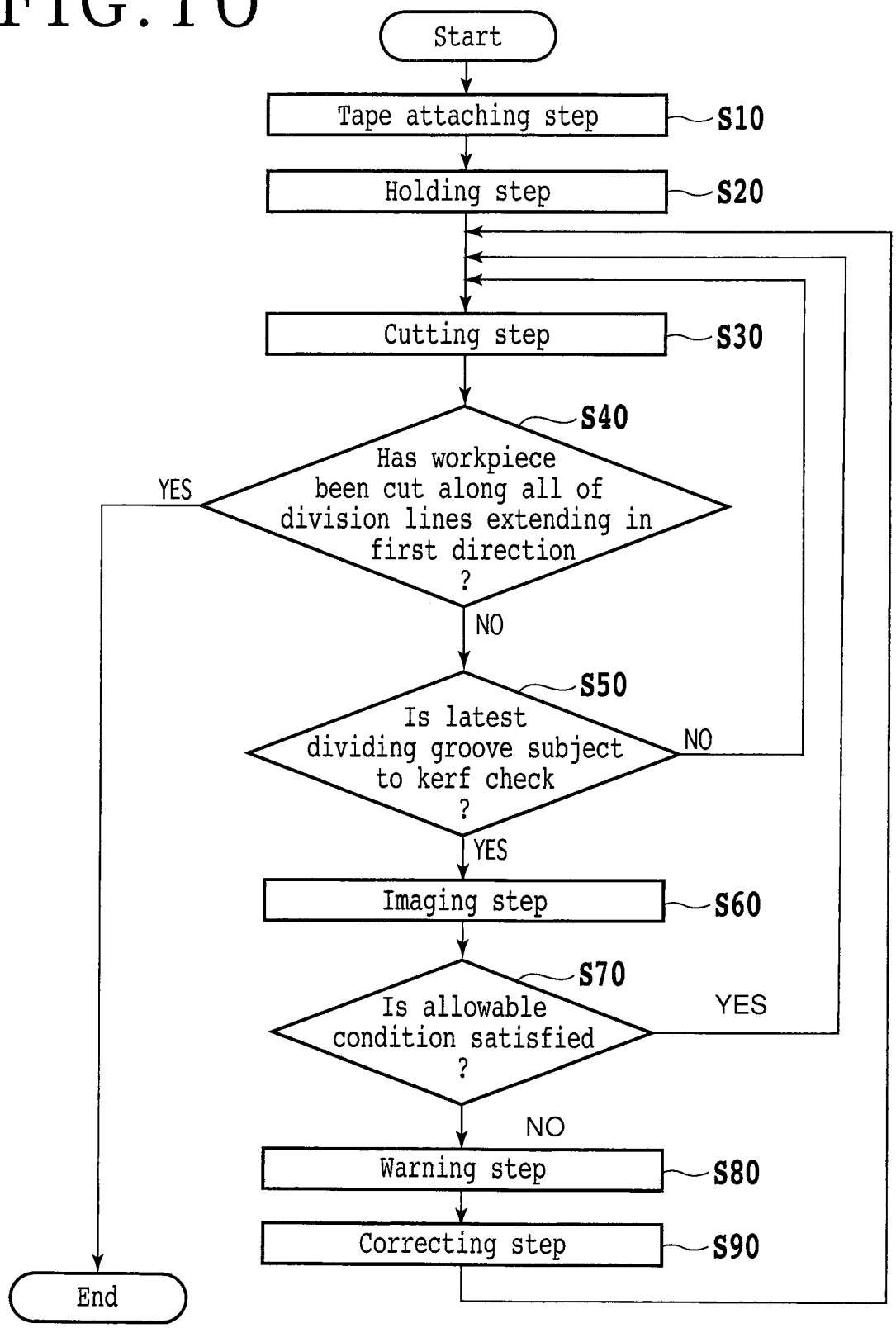
FIG. 10 is a flowchart depicting the workpiece cutting method according to a preferred embodiment of the present invention.

There will now be described a method of cutting the workpiece 11 by using the cutting apparatus 2 to divide the workpiece 11. FIG. 10 is a flowchart depicting the cutting method for the workpiece 11 according to the preferred embodiment. The cutting method will be described by using the steps depicted in FIG. 10. First, the adhesive layer of the tape 19 is attached to the back surface 11*b* of the workpiece 11 and the first surface 17*b* of the ring frame 17. Accordingly, the workpiece unit 21 depicted in FIG. 1B is formed (tape attaching step S10). In the tape attaching step S10, the tape 19 is attached to the workpiece 11 and the ring frame 17 by using a frame attaching apparatus (not depicted) or manually by the operator.

Figure 6A:
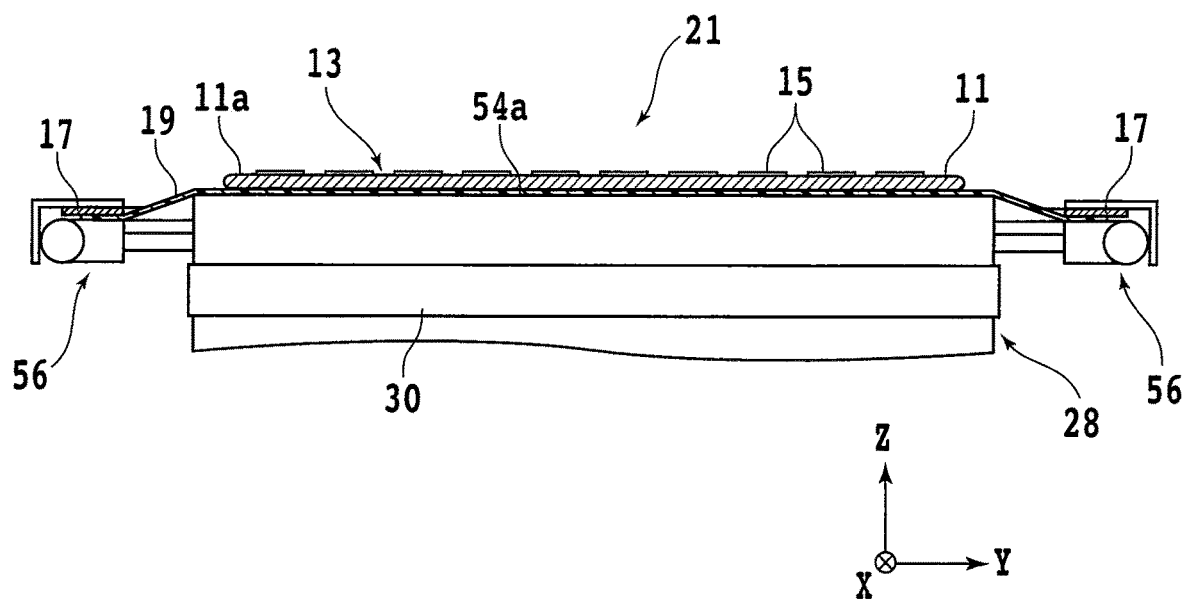
FIG. 6A is a partially sectional side view depicting a holding step of holding the workpiece on the chuck table.

After performing the tape attaching step S10, the tape 19 of the workpiece unit 21 is placed on the holding plate 54, and the ring frame 17 is fixed by the clamp mechanisms 56. Thereafter, the vacuum source is operated to hold the side of the back surface 11*b* of the workpiece 11 through the tape 19 on the holding surface 54*a* of the holding plate 54 under suction (holding step S20). FIG. 6A depicts the holding step S20 of holding the workpiece 11 on the chuck table 28. In the holding step S20, the side of the back surface 11*b* of the workpiece 11 is held on the holding plate 54 as mentioned above. Accordingly, the back surface 11*b* of the workpiece 11 becomes a lower surface, and the front surface 11*a* of the workpiece 11 becomes an upper surface. As a modification, the tape 19 may be attached to the front surface 11*a* of the workpiece 11. In this case, the front surface 11*a* of the workpiece 11 becomes a lower surface, and the back surface 11*b* of the workpiece 11 becomes an upper surface.

After performing the holding step S20, the side of the front surface 11*a* of the workpiece 11 is imaged by the upper camera portion 52*b* to thereby detect a predetermined one of the division lines 13 extending in the first direction. Thereafter, the chuck table 28 is rotated by the motor 32 so that the predetermined division line 13 detected above becomes parallel to the X direction. Thereafter, the cutting blade 50 is positioned directly above the predetermined division line 13 and then rotated at a high speed. Thereafter, the cutting blade 50 is lowered to cut the front surface 11*a* (i.e., the upper surface) of the workpiece 11 until reaching the back surface 11*b* of the workpiece 11. Thereafter, the X moving mechanism 12 is operated to relatively move the chuck table 28 and the cutting blade 50 in the X direction.

Figure 6B:
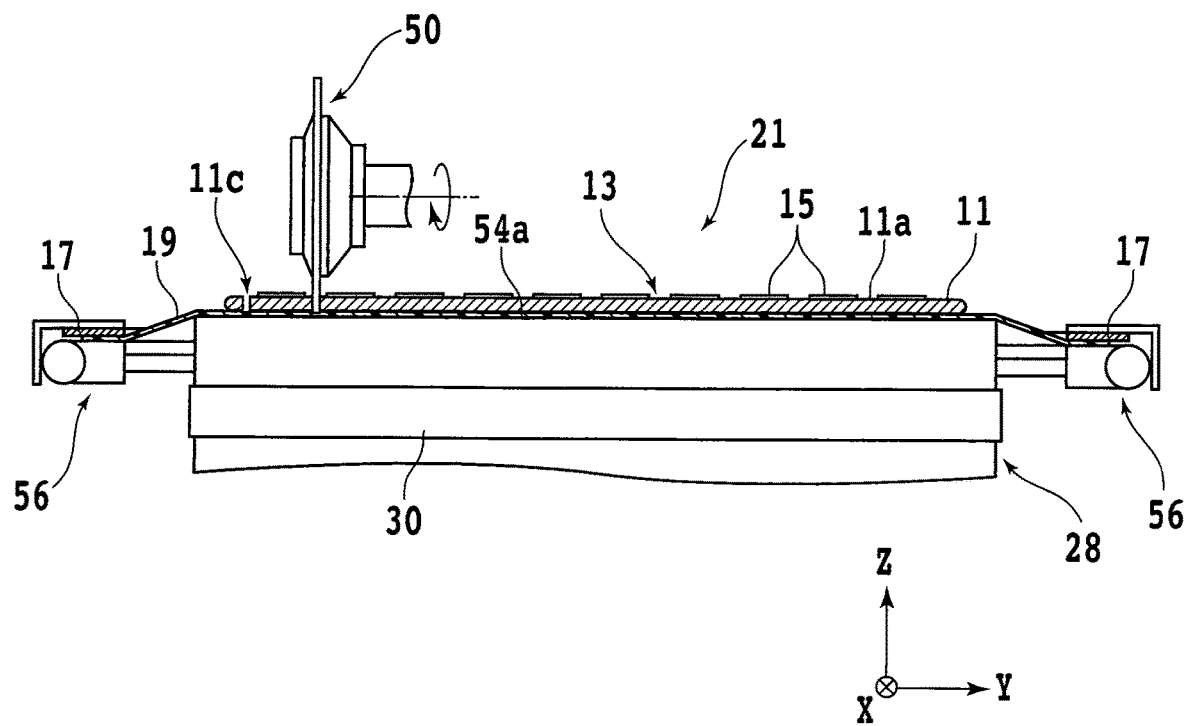
FIG. 6B is a partially sectional side view depicting a cutting step of cutting the workpiece held on a holding surface by using a cutting blade.

Accordingly, the workpiece 11 is fully cut along the path of this relative movement (i.e., along the predetermined division line 13). That is, the workpiece 11 is divided along the predetermined division line 13 (cutting step (processing step) S30). By performing the cutting step S30, a dividing groove 11*c* is formed in the workpiece 11 along the predetermined division line 13 so as to reach the tape 19. FIG. 6B depicts the cutting step S30 of cutting the workpiece 11 held on the holding surface 54*a* by using the cutting blade 50. In the cutting step S30, the workpiece 11 is cut along the predetermined division line 13 to form the dividing groove 11*c* along the predetermined division line 13.

After performing the cutting step S30, the control unit 60 determines whether or not the workpiece 11 has been cut along all of the division lines 13 extending in the first direction (cutting finish confirming step S40). The control unit 60 previously calculates the total number of the division lines 13 extending in the first direction according to the size of the workpiece 11, the index size (i.e., the pitch of the adjacent division lines 13), etc. previously recorded, and then previously stores this total number. Accordingly, the control unit 60 can determine whether or not the workpiece 11 has been cut along all of the division lines 13 extending in the first direction, according to the number of the division lines 13 along which the workpiece 11 has been cut by performing one or more times of cutting steps S30 and the total number of the division lines 13 previously stored.

In the case that the workpiece 11 has been cut along all of the division lines 13 extending in the first direction (YES in S40), the cutting operation along all of the division lines 13 extending in the first direction is finished. In contrast, in the case that the workpiece 11 has not been cut along all of the division lines 13 extending in the first direction (NO in S40), the control unit 60 determines whether or not the dividing groove 11*c* formed in the cutting step S30 is a subject to kerf check (kerf check subject confirming step S50). For example, the control unit 60 is previously set so that every time a predetermined number of dividing grooves 11*c* are formed, kerf check is performed. Accordingly, in the case that the latest dividing groove 11*c* that has been formed latest is not a dividing groove 11*c* corresponding to the predetermined number, which is a subject to kerf check (NO in S50), the program returns to the cutting step S30.

Figure 7:
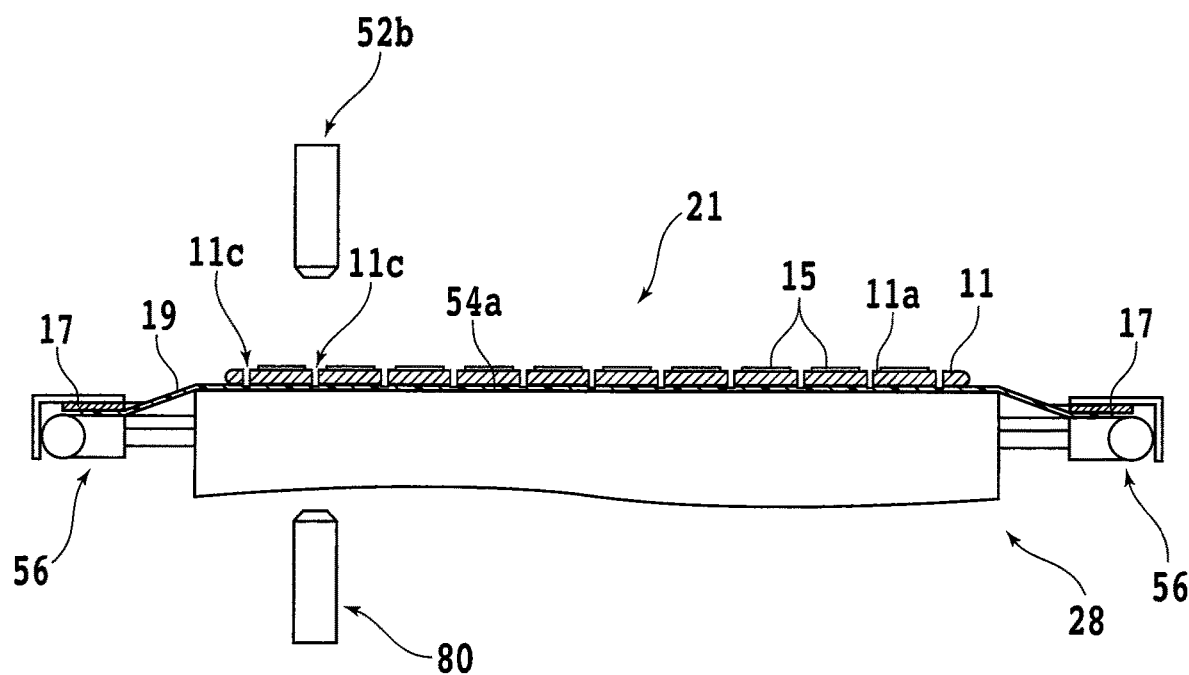
FIG. 7 is a partially sectional side view depicting an imaging step of imaging the upper surface and the lower surface of the workpiece.

In the case that the latest dividing groove 11*c* is the dividing groove 11*c* corresponding to the predetermined number, which is a subject to kerf check (YES in S50), the cutting unit 46 is raised to once stop the cutting operation and the program proceeds to an imaging step S60. FIG. 7 depicts the imaging step S60 of imaging the upper surface and the lower surface of the workpiece 11. In the imaging step S60, the support member 16 is moved in the X direction and the Y direction so that the holding plate 54 and the upper plate 16*b* are interposed between the upper imaging unit 52 and the lower imaging unit 62.

Thereafter, the upper camera portion 52*b* is operated to image at least a part of the dividing groove 11*c* as a subject to kerf check, from the side of the front surface 11*a* (upper surface) of the workpiece 11, thereby obtaining an upper image. Further, the lower camera portion 78 is operated to image the part of the same dividing groove 11*c* at the same coordinate position as that of the upper image, from the side of the back surface 11*b* (lower surface) of the workpiece 11 through the imaging area of the holding plate 54 and the tape 19, thereby obtaining a lower image. In this manner, the dividing groove 11*c* as a subject to kerf check is imaged from the upper and lower sides of the workpiece 11. FIG. 8A depicts an example of the upper image, and FIG. 8B depicts an example of the lower image. FIG. 8C is a schematic sectional view of the workpiece 11 in an area corresponding to that depicted in FIGS. 8A and 8B. FIGS. 8A, 8B, and 8C depict an example of oblique cutting such that the cutting blade 50 is inclined with respect to the Z direction to form an oblique dividing groove 11*c*.

The upper end of the dividing groove 11*c* depicted in FIG. 8A has a width L1 in the Y direction. As depicted in FIG. 8C, the width L1 is the distance from one end $P_{A1}$ in Y direction (e.g., +Y direction depicted by an arrow Y in FIG. 8C) to the other end $P_{A2}$ in the Y direction (e.g., −Y direction opposite to the +Y direction). On the other hand, the lower end of the dividing groove 11*c* depicted in FIG. 8B has a width L2 in the Y direction. As depicted in FIG. 8C, the width L2 is the distance from one end $P_{B1}$ in the Y direction (e.g., +Y direction) to the other end $P_{B2}$ in the Y direction (e.g., −Y direction).

The width L1 of the upper end is the same as the width L2 of the lower end. However, the one end $P_{B1}$ is deviated in position from the one end $P_{A1}$ in the Y direction (e.g., −Y direction), and the other end $P_{B2}$ is also deviated in position from the other end $P_{A2}$ in the Y direction (e.g., −Y direction). In this manner, the lower end of the dividing groove 11*c* (i.e., the bottom of the dividing groove 11c reaching the tape 19) is deviated in position from the upper end of the dividing groove 11c (i.e., the upper opening of the dividing groove 11c exposed to the front surface 11a) in the Y direction (e.g., −Y direction).

FIG. 9A depicts another example of the upper image, and FIG. 9B depicts another example of the lower image. FIG. 9C is a schematic sectional view of the workpiece 11 in an area corresponding to that depicted in FIGS. 9A and 9B. FIGS. 9A, 9B, and 9C depict an example such that the cutting blade 50 has been tapered to form a tapered dividing groove 11c. The upper end of the dividing groove 11c depicted in FIG. 9A has a width L1 in the Y direction. As depicted in FIG. 9C, the width L1 is the distance from one end $P_{A1}$ in the Y direction (e.g., +Y direction depicted by an arrow Y in FIG. 9C) to the other end $P_{A2}$ in the Y direction (e.g., −Y direction opposite to the +Y direction).

On the other hand, the lower end of the dividing groove 11c depicted in FIG. 9B has a width L3 in the Y direction. As depicted in FIG. 9C, the width L3 is the distance from one end $P_{C1}$ in the Y direction (e.g., +Y direction) to the other end $P_{C2}$ in the Y direction (e.g., −Y direction). The width L3 of the lower end is smaller than the width L1 of the upper end. Further, the one end $P_{C1}$ is deviated in position from the one end $P_{A1}$ in the Y direction (e.g., −Y direction), and the other end $P_{C2}$ is deviated in position from the other end $P_{A2}$ in the Y direction (e.g., +Y direction). In this manner, the lower end of the dividing groove 11c is positioned inside the dividing groove 11c in an X-Y plane.

After performing the imaging step S60, the upper image and the lower image are compared with each other (image comparing step S70). In the image comparing step S70, the control unit 60 as a comparing portion compares the difference in width between the dividing groove 11c in the upper image and the dividing groove 11c in the lower image with an allowable value (i.e., allowable condition) for the difference in width previously stored and set in the storing portion in the control unit 60. For example, the difference in width of the dividing groove 11c is the difference between the width L1 and the width L2 or the difference between the width L1 and the width L3 mentioned above. In the case that the difference in width of the dividing groove 11c is less than or equal to the allowable value (i.e., the difference in width of the dividing groove 11c satisfies the allowable condition) (YES in S70), the support member 16 is returned to the position below the cutting blade 50, and the program returns to the cutting step S30.

Conversely, in the case that the difference in width of the dividing groove 11c is greater than the allowable value (i.e., the difference in width of the dividing groove 11c does not satisfy the allowable condition) (NO in S70), the control unit 60 operates at least one of the touch panel, the warning lamp, and the speaker to issue a warning to the operator (warning step S80). After performing the warning step S80, the operator corrects the cutting blade 50 or replaces the cutting blade 50 (correcting step S90). In particular, when oblique cutting has occurred as depicted in FIG. 8C, the cutting blade 50 is preferably replaced.

In contrast, when the cutting blade 50 is tapered or unevenly worn, the width of the dividing groove 11c on the side of the lower surface (the back surface 11b) of the workpiece 11 becomes smaller than that on the side of the upper surface (the front surface 11a) of the workpiece 11 as depicted in FIG. 9C. In this case, dressing for the cutting blade 50 is performed to thereby correct the cutting blade 50. For example, the workpiece unit 21 is removed from the chuck table 28, and a dressing board (not depicted) is next transferred to the chuck table 28. The dressing board is next held on the chuck table 28. Thereafter, the cutting blade 50 is rotated and then lowered to abut against the dressing board to thereby perform dressing for the cutting blade 50. After performing this dressing, the dressing board is removed from the chuck table 28, and the workpiece unit 21 is held again on the chuck table 28. As a modification, an auxiliary chuck table (not depicted) may be provided adjacent to the chuck table 28, and a dressing board (not depicted) may be set on the auxiliary chuck table. In this case, when the control unit 60 has grasped that the allowable condition is not satisfied or a warning has been issued, the cutting unit 46 is moved to the position above the dressing board set on the auxiliary chuck table. Thereafter, the cutting blade 50 is rotated and then lowered to abut against the dressing board to thereby perform dressing for the cutting blade 50. After performing the correcting step S90, the program returns to the cutting step S30.

In the imaging step according to the preferred embodiment, the upper camera portion 52b and the lower camera portion 78 are operated to image a part of the dividing groove 11c located at the same coordinate position on the holding surface 54a. Not only when defective processing has occurred on the upper surface of the workpiece 11, but also when defective processing has also occurred on the lower surface of the workpiece 11, the defective processing can be detected. When defective processing has occurred on the lower surface of the workpiece 11, the defective processing can be eliminated by any means. Accordingly, as compared with the case that kerf check on the lower surface of the workpiece 11 is not performed, but kerf check on only the upper surface of the workpiece 11 is performed, the production of defective chips can be prevented. If defective chips are produced, it is possible to reduce the possibility that a large amount of defective chips may be produced.

In a conventional method for kerf check, the cutting blade 50 is rotated to cut the front side of a checking member such as a silicon piece and a carbon piece having a shape like a rectangular prism to a depth corresponding to the half of the thickness of the checking member (i.e., the checking member is half cut from the front side thereof). Thereafter, an end surface of the checking member on a plane perpendicular to the longitudinal direction of the dividing groove 11c is checked by using a microscope. In this manner, it is very troublesome to check the condition of the cutting blade 50 by using the conventional method. Further, the condition of oblique cutting changes according to the material and depth of cut of the workpiece 11 and the feed speed of the chuck table 28, for example. Further, the condition of oblique cutting sometimes changes among a front area of the workpiece 11 where the cutting blade 50 enters the workpiece 11, a rear area of the workpiece 11 where the cutting blade 50 leaves the workpiece 11, and an intermediate area of the workpiece 11 between the front area and the rear area. In the conventional checking method using the checking member mentioned above, the condition of oblique cutting in the workpiece 11 in forming the dividing groove 11c cannot be checked. To the contrary, according to the preferred embodiment, the condition of oblique cutting can be easily detected by temporarily stopping the cutting operation and then imaging the workpiece 11. Further, whether the cutting blade 50 is unevenly worn can also be easily detected.

Further, in the image comparing step S70, the control unit 60 as a comparing portion may compare the amount of deviation in position between the dividing groove 11c on the upper image and the dividing groove 11c on the lower image with an allowable value (i.e., allowable condition) for the amount of deviation previously stored and set in the storing portion in the control unit 60. For example, the amount of deviation in position is the amount of displacement between the one end $P_{A1}$ and the one end $P_{B1}$ or the amount of displacement between the one end $P_{A1}$ and the one end $P_{C1}$. In the case that the amount of deviation in position is less than or equal to the allowable value (i.e., the amount of deviation in position satisfies the allowable condition) (YES in S70), the support member 16 is returned to the position below the cutting blade 50, and the program returns to the cutting step S30.

Conversely, in the case that the amount of deviation in position is greater than the allowable value (i.e., the amount of deviation in position does not satisfy the allowable condition) (NO in S70), the control unit 60 operates at least one of the touch panel, the warning lamp, and the speaker to issue a warning to the operator (warning step S80). After performing the warning step S80, the cutting blade 50 is corrected (correcting step S90). After performing the correcting step S90, the program returns to the cutting step S30. In the image comparing step S60, either the difference in width of the dividing groove 11c or the amount of deviation in position of the dividing groove 11c may be compared with the allowable value. Alternatively, both the difference in width and the amount of deviation in position may be compared with the allowable value.

As a modification, in the image comparing step S70, at least one of the average value, maximum value, and minimum value of chipping sizes on the upper image and on the lower image may be compared with an allowable value previously set. In the case that at least one of the average value, maximum value, and minimum value is less than or equal to the allowable value (i.e., the allowable condition is satisfied) (YES in S70), the program returns to the cutting step S30. As another modification, the amount of deviation in position between the division line 13 and the dividing groove 11c on the upper image may be compared with an allowable value previously set. In the case that the amount of deviation in position is less than or equal to the allowable value (i.e., the allowable condition is satisfied) (YES in S70), the program returns to the cutting step S30. Conversely, in the case that the allowable condition is not satisfied (NO in S70), the warning step S80 is performed and the correcting step S90 is next performed to correct or replace the cutting blade 50. Thereafter, the program returns to the cutting step S30.

Further, the structure and method according to the preferred embodiment may be suitably modified without departing from the scope of the object of the present invention. For example, the cutting unit 46 may be replaced by a laser applying unit for applying a laser beam having an absorption wavelength to the workpiece 11. In this case, the processing step (corresponding to the cutting step S30 in FIG. 10) includes the steps of applying the laser beam to the workpiece 11 and relatively moving the laser applying unit and the chuck table 28 to thereby form the dividing groove 11c. Accordingly, the workpiece 11 is cut by the laser beam. Also in this case, the imaging step S60 is next performed to obtain an upper image and a lower image, and the image comparing step S70 is next performed by using the upper image and the lower image obtained above.

Further, in the above preferred embodiment, the upper camera portion 52b and the lower camera portion 78 are fixed in the X direction and the Y direction, and movable in only the Z direction. As a modification, the upper camera portion 52b and the lower camera portion 78 may be movable in all of the X direction, the Y direction, and the Z direction. Also in this case, the relative positional relation between the upper camera portion 52b and the lower camera portion 78 can be specified. Accordingly, the lower camera portion 78 can image any object at the same coordinate position as that imaged by the upper camera portion 52b.

For example, in the condition where the workpiece unit 21 is not placed on the holding plate 54, the lower camera portion 78 may image the upper camera portion 52b, thereby specifying the X-Y coordinate position of the upper camera portion 52b. If the optical axis of the lower camera portion 78 does not coincide with the optical axis of the upper camera portion 52b, the position of the lower camera portion 78 relative to the upper camera portion 52b is corrected so that the optical axis of the lower camera portion 78 coincides with the optical axis of the upper camera portion 52b. Alternatively, the upper camera portion 52b may image the lower camera portion 78, and the position of the upper camera portion 52b relative to the lower camera portion 78 may next be corrected.

In the case that the upper camera portion 52b and the lower camera portion 78 are movable in the X direction, the Y direction, and the Z direction, the lower camera portion 78 may further include an infrared camera portion having an imaging device for detecting infrared light and converting it into an electrical signal and an infrared light applying unit for applying infrared light. In this case, a target pattern (not depicted) may be formed on the side of the front surface 11a (upper surface) of the workpiece 11, and this target pattern may be imaged by the upper camera portion 52b and also imaged by the infrared camera portion of the lower camera portion 78. Accordingly, the control unit 60 can specify a part of the dividing groove 11c at the same X-Y coordinate position on the holding surface 54a. Further, while the X moving mechanism 12 and the Y moving mechanism 22 are operated to move the support member 16 in the X direction and the Y direction in the above preferred embodiment, the Y moving mechanism 22 may be omitted. In this case, the first vertical column 36 may be connected to another Y moving mechanism instead of fixed to the stationary base 4. Accordingly, the cutting unit 46 and the upper imaging unit 52 become movable in the Y direction and the Z direction.

In the case that the suction passage including areas 54c and the peripheral area 54d are formed of an opaque material, an upper image and a lower image may be formed in only the crossing suction passage excluding area 54b (imaging step S60). According to the upper image and the lower image obtained above, the image comparing step S70 may be performed. In the remaining area other than the suction passage excluding area 54b, a lower image cannot be obtained and only an upper image can be obtained. In this case, the image comparing step S70 is not performed, but the conventional kerf check is performed according to the upper image.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A workpiece cutting method for cutting a workpiece having an upper surface and a lower surface, comprising:
   a tape attaching step of attaching a tape to the lower surface of said workpiece;
   a holding step of holding the lower surface of said workpiece through said tape on a holding table including a holding plate, said holding plate having a holding surface for holding said workpiece, at least a part of said holding surface being an imaging area formed of a material transparent to visible light;

a processing step of cutting said workpiece held on said holding table to divide said workpiece, thereby forming a dividing groove having a depth reaching said tape; and an imaging step of imaging at least a part of said dividing groove from the upper surface side of said workpiece by using an upper camera portion located above said holding plate, thereby obtaining an upper image, and also imaging said part of said dividing groove from the lower surface side of said workpiece through said imaging area of said holding plate and said tape by using a lower camera portion located below said holding plate, thereby obtaining a lower image.

2. The workpiece cutting method according to claim 1, further comprising:
an image comparing step of comparing said upper image and said lower image obtained in said imaging step.

3. The workpiece cutting method according to claim 2, said image comparing step including a step of comparing at least one of a difference in width between said dividing groove on said upper image and said dividing groove on said lower image and an amount of deviation in position between said dividing groove on said upper image and said dividing groove on said lower image with an allowable condition previously set,
said workpiece cutting method further comprising:
a warning step of issuing a warning in a case that at least one of said difference in width and said amount of deviation in position does not satisfy said allowable condition.

4. The workpiece cutting method according to claim 2 wherein at least one of the average value, maximum value, and minimum value of chipping sizes on said upper image and on said lower image is compared with an allowable value.

5. The workpiece cutting method according to claim 2 wherein the image comparing step is performed using a control unit.

6. The workpiece cutting method according to claim 5, said image comparing step including a step of comparing a difference in width between said dividing groove on said upper image and said dividing groove on said lower image with an allowable value,
said workpiece cutting method further comprising:
a warning step of issuing a warning in a case the difference in width exceeds the allowable value.

7. The workpiece cutting method according to claim 6, further comprising correcting the cutting blade if the difference in width exceeds the allowable value.

8. The workpiece cutting method according to claim 6, wherein the warning step is issued if the difference in width exceeds the allowable value in said image comparing step, indicating a tapered groove has been formed in said dividing groove.

9. The workpiece cutting method according to claim 8, further comprising correcting the cutting blade if the amount of deviation in position exceeds the allowable value in position.

10. The workpiece cutting method according to claim 6, further comprising replacing the cutting blade if the difference in width exceeds the allowable value.

11. The workpiece cutting method according to claim 5, said image comparing step including a step of comparing an amount of deviation in position between said dividing groove on said upper image and said dividing groove on said lower image with an allowable value in position,
said workpiece cutting method further comprising:
a warning step of issuing a warning in a case the amount of deviation in position exceeds the allowable value in position.

12. The workpiece cutting method according to claim 11, wherein the warning step is issued if the amount of deviation in position exceeds the allowable value in position and the difference in width does not exceed an allowable value in width, indicating an oblique groove is formed in said dividing groove.

13. The workpiece cutting method according to claim 11, further comprising replacing the cutting blade if the amount of deviation in position exceeds the allowable value in position.

14. The workpiece cutting method according to claim 2, wherein a predetermined number of dividing grooves are to be cut in a first direction in the workpiece and wherein the image comparing step is performed before the predetermined number of dividing grooves have been cut in the first direction in the workpiece.

15. The workpiece cutting method according to claim 1 wherein during the imaging step the upper camera portion and the lower camera portion image the respective upper surface side and the lower surface side of the dividing groove at the same X-Y coordinate position.

16. The workpiece cutting method according to claim 1 wherein the upper camera portion has an objective lens having a first optical axis and the lower camera portion has an objective lens having a second optical axis and wherein
during the imaging step lower camera portion is located so that the second optical axis of the objective lens of the lower camera portion coincides with the first optical axis of the objective lens of the upper camera portion.

* * * * *